(12) United States Patent
Stevens et al.

(10) Patent No.: US 8,459,276 B2
(45) Date of Patent: Jun. 11, 2013

(54) BROKEN WAFER RECOVERY SYSTEM

(75) Inventors: Craig Lyle Stevens, Ben Lomond, CA (US); David Eric Berkstresser, Los Gatos, CA (US); Wendell Thomas Blonigan, Pleasanton, CA (US)

(73) Assignee: Orbotech LT Solar, LLC., San Jose, CA (US)

( * ) Notice: Subject to any disclaimer, the term of this patent is extended or adjusted under 35 U.S.C. 154(b) by 0 days.

(21) Appl. No.: 13/115,064

(22) Filed: May 24, 2011

(65) Prior Publication Data

US 2012/0298141 A1    Nov. 29, 2012

(51) Int. Cl.
*B08B 3/00* (2006.01)
(52) U.S. Cl.
USPC ............................ 134/60; 134/133; 134/184
(58) Field of Classification Search
None
See application file for complete search history.

(56) References Cited

U.S. PATENT DOCUMENTS

| 2003/0106574 A1* | 6/2003 | Krolak | 134/137 |
| 2009/0181593 A1* | 7/2009 | Kim | 445/24 |
| 2009/0309905 A1* | 12/2009 | Yoshioka et al. | 347/8 |

* cited by examiner

*Primary Examiner* — Eric Golightly
(74) *Attorney, Agent, or Firm* — Nixon Peabody LLP; Joseph Bach, Esq.

(57) ABSTRACT

An apparatus and method for recovery and cleaning of broken substrates, for fabrication systems using silicon wafers. A placing mechanism moves a suction head to a location of the broken substrate and a suction pump coupled to a flexible hose is used to remove the broken pieces. A hood is positioned at the inlet of the suction head, and setback extensions are provided at the bottom of the hood to allow air flow into the inlet and prevent thermal conductance from the tray to the hood. Pins are extendable about the inlet of the suction head to enable breakage of the substrate to smaller pieces for removal.

20 Claims, 6 Drawing Sheets

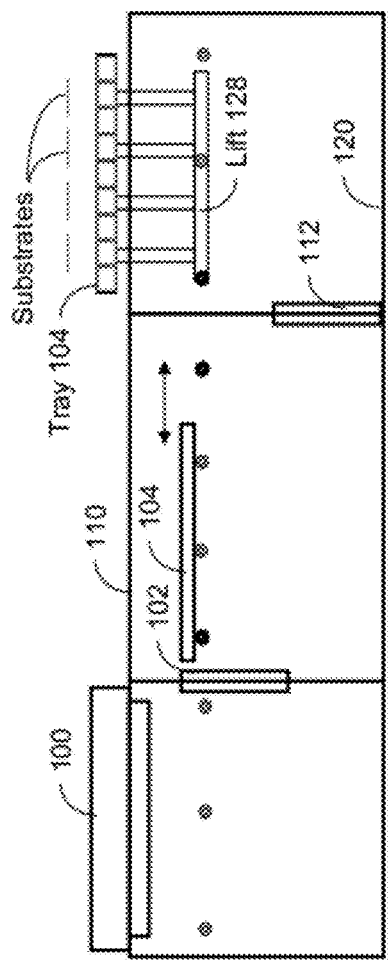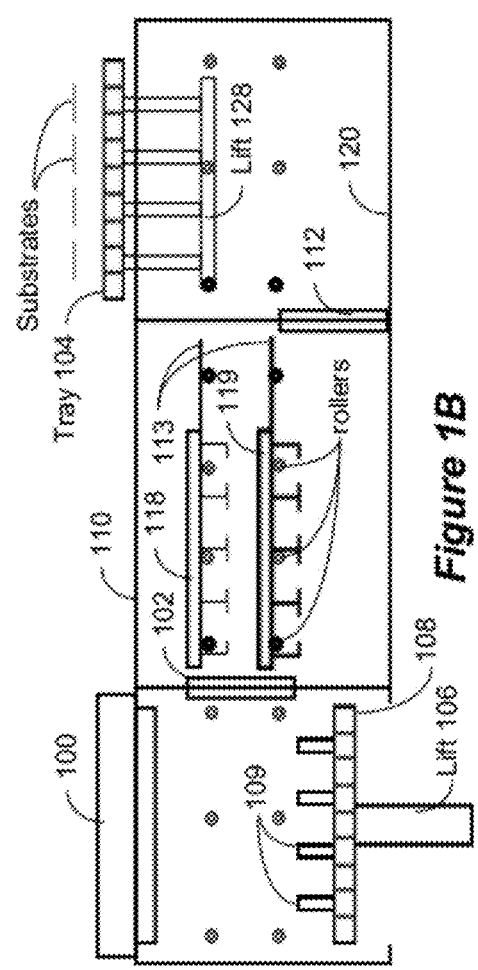

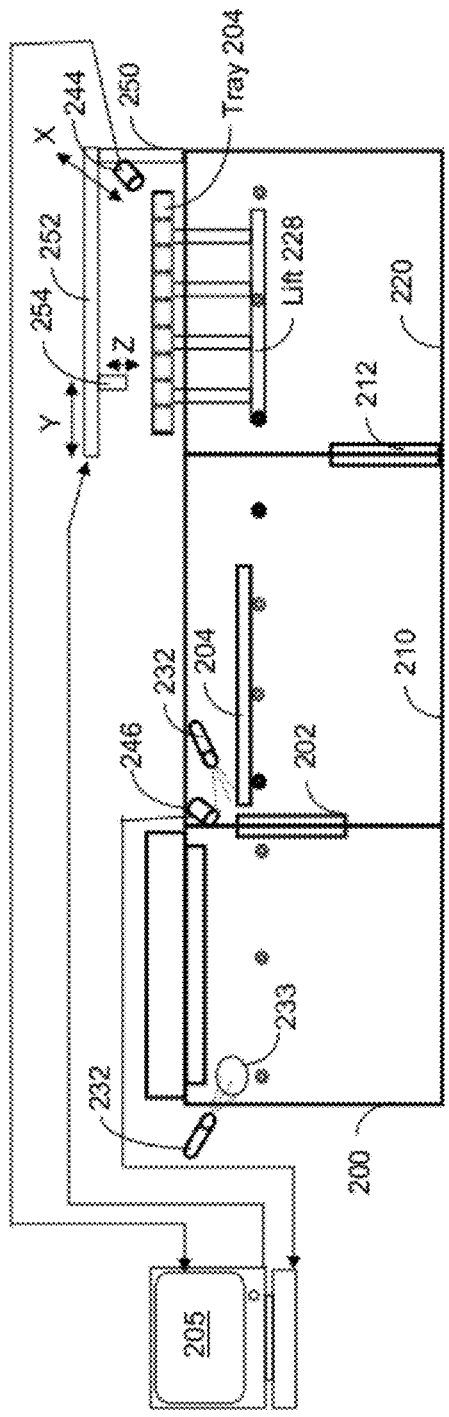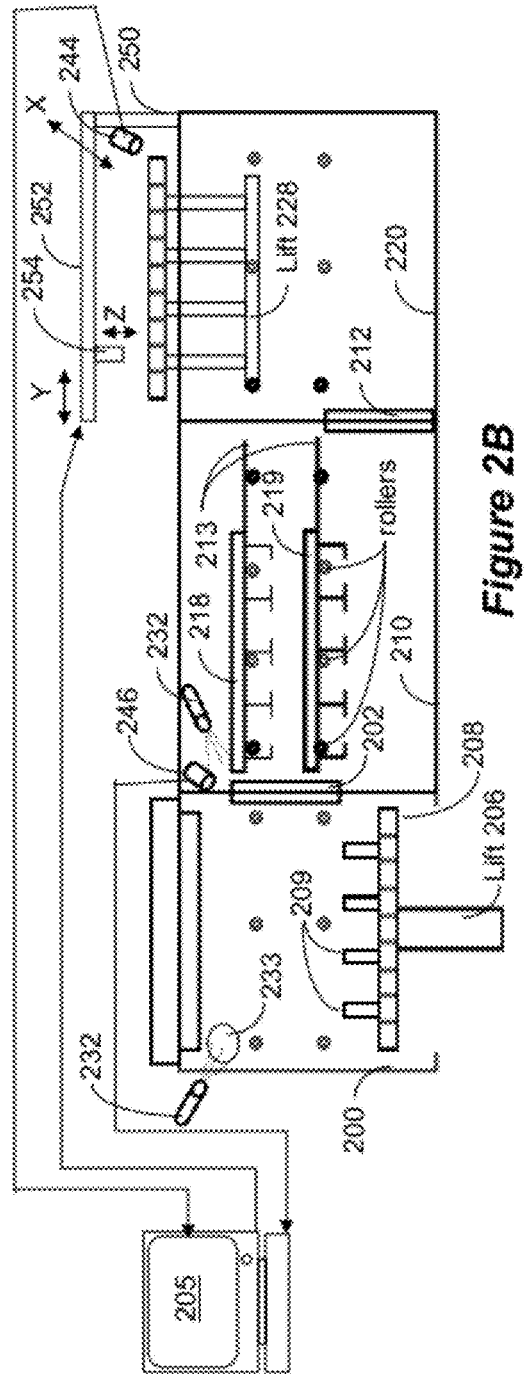

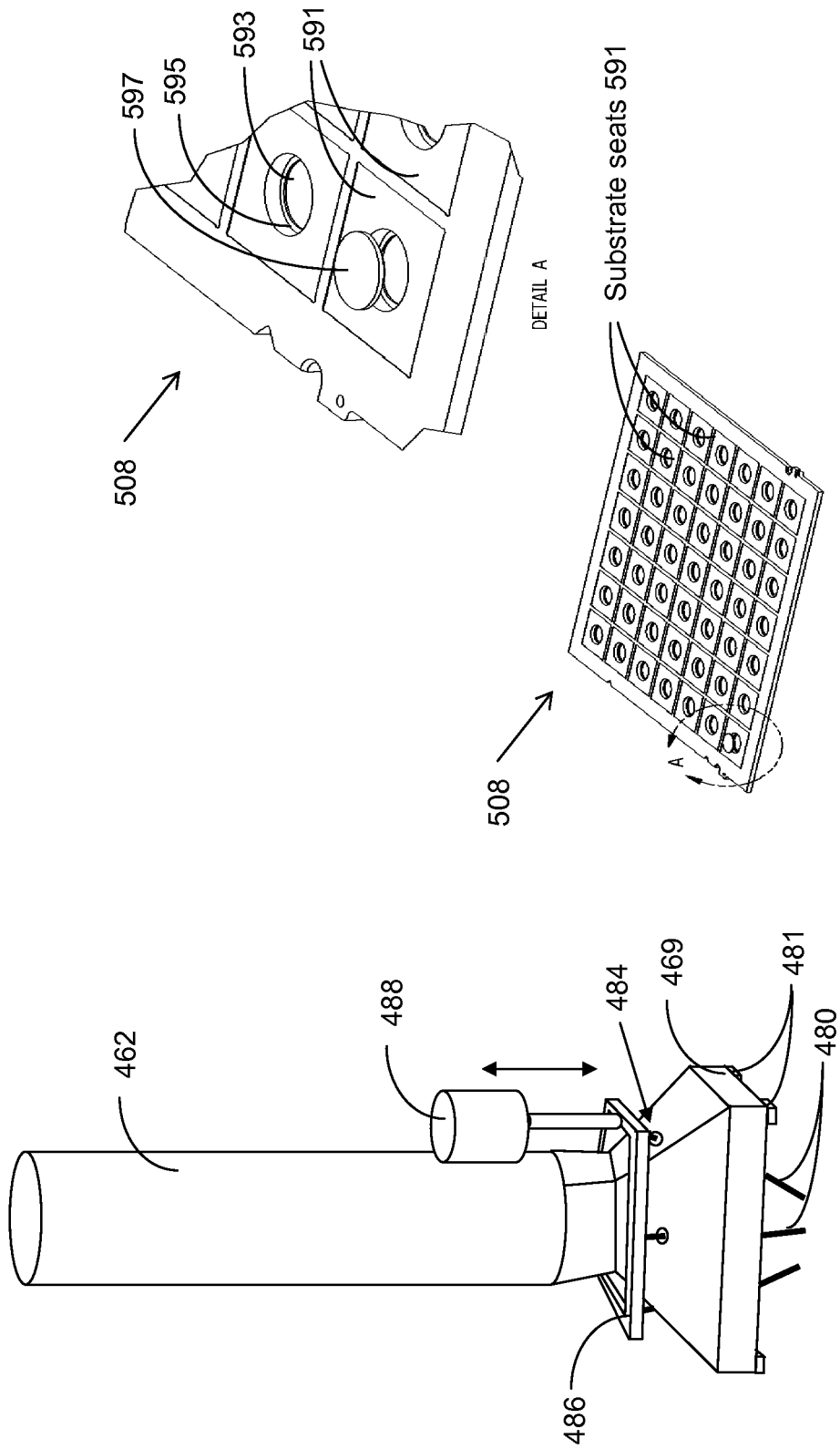

BROKEN WAFER RECOVERY SYSTEM

BACKGROUND

1. Field of the Invention

The present invention relates to system and method for processing substrates, such as silicon wafers for semiconductor, solar cells, and other applications, in a clean environment. More specifically, the invention relates to system and method for handling broken substrates, especially broken silicon wafers.

2. Description of the Related Art

State of the art systems for fabrication of semiconductor wafers generally utilize a mainframe, about which several processing chambers are mounted. Other systems, especially those used for solar cell fabrication, are structured as in-line systems, wherein transport of substrates from one chamber to the next is performed in a linear fashion. Regardless of the architecture used, at some point the wafers have to be transferred from atmospheric environment to vacuum environment. This is done in order to introduce the wafers into a vacuum processing chamber, such as chemical vapor deposition (CVD), plasma enhanced chemical vapor deposition (PECVD), physical vapor deposition system (PVD), etc.

In many systems used for fabricating integrated circuits, the wafers move from chamber to chamber individually. On the other hand, for solar cells fabrication, many linear systems utilize trays, upon which multiple silicon wafers are placed. The tray can move from chamber to chamber in a linear fashion, or the wafers can be moved separately and placed on stationary trays, such that in each chamber many silicon wafers are processes concurrently on a single tray e.g., 64 substrates of 125 mm by 125 mm each.

As can be appreciated, such systems operate in clean rooms under strict handling protocols. However, at times it happens that a wafer breaks in the system, whether during processing or during transport. Such breakage generates broken pieces, particles, and dust, that can cause contamination and lead to disruptions of production. Generally, when such breakage occurs, the system has to be stopped and disassembled in order to perform manual cleaning. Such disruption is costly from the manufacturing throughput perspective, and also requires manual labor for the cleaning. The effect on system throughput is especially acute in solar cell fabrication, where generally each system's throughout is on the order of one to three thousand wafers per hour.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the present invention provide system and method for detection, recovery and cleaning of broken substrates. Embodiments of the invention are especially beneficial for fabrication systems using silicon wafer carried on trays. Embodiments of the invention enable removal of broken wafers and particles from within the fabrication system without requiring disassembly of the system and without requiring manual labor.

According to various embodiments of the subject invention, a broken substrate removable system for use in a substrate processing system is provided, comprising: a suction head having an inlet; a placing mechanism for moving the suction head to location of the broken substrate; a suction pump; and a flexible hose coupling the suction head to the suction pump. A hood is positioned at the inlet of the suction head, and setback extensions are provided at the bottom of the hood to allow air flow into the inlet and prevent thermal conductance from the tray to the hood. A plurality of movable pins are extendable about the inlet of the suction head to enable breakage of the wafer to smaller pieces for easy removal. The head placing mechanism can be constructed as a first gantry providing linear motion in one direction and a second gantry providing linear motion is a perpendicular direction. Alternatively, The head placing mechanism can be constructed as a rotatable pivot providing rotational motion and an arm providing linear motion. A parking and disposal station enables parking of the suction head when not in use and disposal of broken pieces removed by the suction head. Optical sensors, such as digital cameras, are coupled to a controller to detect a broken wafer, and monitor and/or control the placing mechanism to place the suction head above the location of the broken wafer, and to confirm the broken wafer has been successfully removed post operation.

According to embodiments of the invention, a method for removing pieces of broken wafer from a plate supporting a plurality of wafers in a fabrication system is disclosed, comprising: analyzing an optical signal to determine whether one of the plurality of wafers is broken; when it is determined that a broken wafer occupies a position on the plate, transporting the plate to an exchange station, placing a suction head over the position of the broken wafer, and activating a suction pump to remove the pieces of the broken wafer. Optionally, when it is determined that a broken wafer occupies a position on the plate, the plate is moved to a position of a secondary optical sensor to verify that a broken wafer is on the plate. In another embodiment, incoming wafers are analyzed to determine if there are breakages or damage to the wafers prior to processing. Suspected wafers are removed from the incoming tray to minimize the potential of wafers breaking inside the processing apparatus.

Other aspects and features of the invention will become apparent from the description of various embodiments described herein, and which come within the scope and spirit of the invention as claimed in the appended claims.

BRIEF DESCRIPTION OF THE DRAWINGS

FIGS. 1A and 1B are general schematics depicting major components of examples of system architectures for implementing embodiments of the invention.

FIGS. 2A and 2B are general schematics depicting major components of system architectures according to embodiments of the invention, showing the broken substrate recovery system installed over the factory interface of the systems shown in FIGS. 1A and 1B.

FIG. 4 is a general schematic depicting further elements of the broken wafer recovery system shown in FIGS. 3A and 3B.

FIG. 5 illustrates a susceptor that can be used for processing substrates in plasma processing chambers.

Figure 2C:
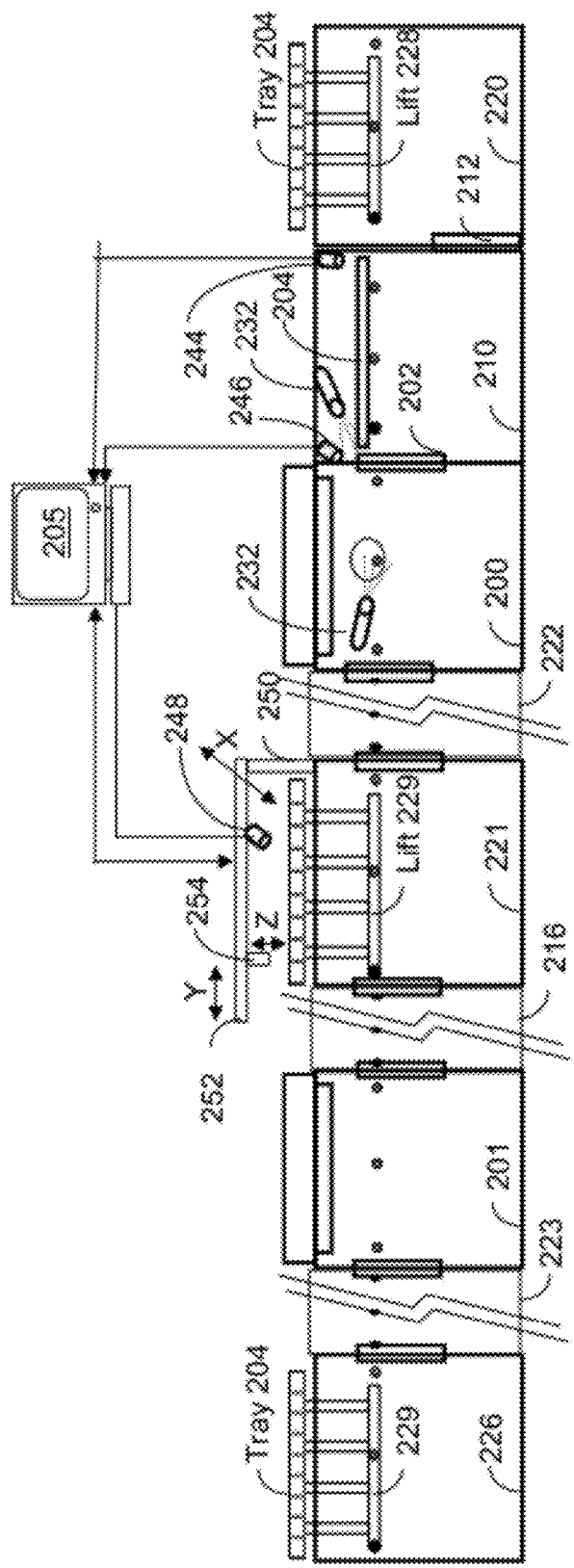
FIG. 2C illustrates another embodiment, showing two processing chambers arranged linearly, and a flipping station with broken wafer recovery system positioned between the two processing chambers.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Various embodiments of the present invention provide apparatus and method for recovering pieces of wafers that were broken during the fabrication of, e.g., semiconductor integrated circuits, solar cells, flat panel displays, LED's etc. Embodiments of the invention are particularly useful for systems that utilize trays to transport and/or process wafers.

FIG. 1A illustrates example of a processing system that can be used to implement embodiments of the invention. It should be appreciated that other architectures and other systems can be used to implement the invention, and that the system shown in FIG. 1A is provided only as an example. For simplicity of explanation, only a single processing chamber 100 is illustrated, situated at one end of a simple linear system. In this embodiment, the processing chamber is a plasma processing chamber such as, for example, a PECVD or PVD processing chamber. One vacuum valve, 102, is provided on the side of the chamber 100, to enable introduction of trays 104 into the chamber 100. A loadlock chamber 110 is provided on the side of chamber 100, and vacuum valve 112 is provided at the entry of loadlock 110. A loading chamber 120, also referred to as factory interface, is provided at the entry side of loadlock chamber 110, and is used to load trays 104 for processing, and unload processed wafers from the system.

The flow of wafers illustrated in FIG. 1A will now be described in further details, starting with wafers loaded on the right side of the system. A tray 104 with substrates is loaded into loading chamber 120. Notably, the tray may remain within the system and wafers loaded onto the tray within the system, or the tray may be loaded outside the system and brought to and loaded onto loading chamber 120. The tray 104 may carry, for example, 64 substrates arranged in a two-dimensional array. The tray is then introduced into loadlock 110, gate valves 102 and 112 are closed, and vacuum pump is energized to bring the loadlock 110 to a vacuum level matching or sufficiently close to that of chamber 100. Then valve 102 is open and the tray is moved into the chamber for processing. That is, the wafers remain on the tray 104 while they are processed in chamber 100. After processing is completed, the reverse operation is performed to remove the tray 104 from the chamber 100 and from the loadlock 110, so as to remove the processed wafers and load fresh wafers for processing.

FIG. 1B depicts a similar system as that of FIG. 1A, and similar elements to those shown in FIG. 1A are identified with similar reference numerals. In the embodiment of FIG. 1B, the tray 104 does not move into the loadlock 110. Rather, in the embodiment of FIG. 1B, in loading chamber 120 the wafers are removed from the tray 104 and loaded onto one of specially designed wafer hangers 118 or 119. The loaded hanger, say 118, is then moved into loadlock chamber 110 and the valve 112 is then closed. A vacuum is then drawn in loadlock chamber 110. Once the proper vacuum level is reached, valve 102 is opened and the wafer hanger moves into processing chamber 100, wherein the wafers are removed from the wafer hanger and placed onto a susceptor 108. The wafer hanger is then removed from the processing chamber 100, back to the loadlock chamber 110, and the valve 102 is closed. The processing chamber 100 is then energized to process the substrates that are in the chamber.

Meanwhile, concurrent with the above processing, the other wafer hanger 119 is positioned in the loading chamber 120 and is loaded with new substrates. The loaded hanger 119 is then moved into the loadlock 110, valve 112 is closed, and vacuum is drawn. When processing in chamber 100 is completed, valve 102 is opened and wafer hanger 118 is moved from loadlock 110 into chamber 100 so as to collect the processed substrates, and hanger 119 is moved from loadlock chamber 110 into chamber 100, so as to deposit its new substrates for processing in chamber 100. When both hangers have been removed back into loadlock 110, the valve 102 is closed, and chamber 100 is energized for processing of the new wafers. The loadlock 110 is then vented to atmospheric pressure, upon which valve 112 is then opened and hanger 118 is moved into loading chamber 120, to unload its processed wafers and load new substrates for processing.

FIG. 2A is a general schematic depicting major components of a system architecture according to an embodiment of the invention, showing the broken substrate recovery system installed over the factory interface of the system shown in FIG. 1A. In FIG. 2A, elements that are similar to those shown in FIG. 1A are identified with similar reference numeral, except that they are in the 2xx series. In FIG. 2A, loading chamber 220 is fitted with a first sensing mechanism, 244, which receives signals from controller 205, once a new set of wafers have been received by the load chamber, to detect breakage of wafers on trays 204 entering and/or exiting loadlock chamber 210. In this embodiment, sensing mechanism 244 is a light sensor or a camera, which is positioned on the broken wafer recovery system described below. Also, a second sensing mechanism, 246, is provided to detect broken wafers inside the processing chamber 100. In this embodiment, sensing mechanism 246 is a camera coupled to image processor and a monitor of the controller 205. In this embodiment camera 246 is positioned inside the loadlock 210 and is oriented to view the interior of chamber 200 when gate valve 202 is opened. An illumination source 232 may be provided for illuminating the area viewed by the sensing mechanism 246. Illumination source 232 may be positioned inside the loadlock 210, may be provided outside the processing chamber and illuminating the interior via a window 233, etc. The image processor in controller 205 uses image processing program to determine whether a wafer has broken inside the chamber 200, while the monitor of controller 205 enables an operator to confirm or override the image processor's determination. The monitor also enables the operator to designate wafers as broken when the image processor missed such breakage.

The broken wafer recovery system shown in FIG. 2A has an x-motion gantry 250 which moves the y-motion gantry 252 in the x direction, as shown by the double-headed arrow marked X. The y-motion gantry moves a suction head 254 in the y direction, as indicated by the double-headed arrow marked Y. The suction head can also move vertically, as illustrated by the double-headed arrow marked Z. In this way, the suction head can be placed above any coordinate on tray 204. When a broken wafer is identified in the process chamber 200, the tray 204 is moved to the loading chamber 220. Conversely, if the broken wafer is detected on incoming or outgoing wafer trays, the tray is held in the load chamber for broken wafer removal. The controller 205 moves the suction head to the location of the broken wafer, and energizes the suction pump 365 to remove the broken wafer from the tray. Sensing mechanism 244 then confirms successful removal of the broken wafer, and the system returns to operation.

FIG. 2B is a general schematic depicting major components of a system architecture according to an embodiment of the invention, showing the broken substrate recovery system installed over the factory interface of the system shown in FIG. 1B. In FIG. 2B, elements that are similar to those shown in FIG. 1B are identified with similar reference numeral, except that they are in the 2xx series. In FIG. 2B, loading chamber 220 is fitted with a first sensing mechanism, 244, which receives signals from controller 205, once a new set of wafers have been received by the load chamber, to detect breakage of wafers on trays 204 entering and/or exiting load-lock chamber 210. In this embodiment, sensing mechanism 244 is a light sensor, thru beam sensors, a camera, etc., which is positioned on the broken wafer recovery system described below. Also, a second sensing mechanism, 246, is provided to detect broken wafers inside the processing chamber 200. In this embodiment, sensing mechanism 246 is a camera coupled to image processor and a monitor of controller 205. In this embodiment camera 246 is positioned inside the loadlock 210 and is oriented to view the interior of chamber 200 when gate valve 202 is opened. Illumination source 232 may be positioned inside the loadlock 210, may be provided outside the processing chamber and illuminating the interior via a window 233, etc. The image processor of controller 205 uses image processing program to determine whether a wafer has broken inside the chamber 200, while the monitor of controller 205 enables an operator to confirm or override the image processor's determination. The monitor also enables the operator to designate wafers as broken when the image processor missed such breakage.

The broken wafer recovery system shown in FIG. 2B has an x-motion gantry 250 which moves the y-motion gantry 252 in the x direction, as shown by the double-headed arrow marked X. The y-motion gantry moves a suction head 254 in the y-direction, as indicated by the double-headed arrow marked Y. The suction head can also move vertically, as illustrated by the double-headed arrow marked Z. In this way, the suction head can be placed above any coordinate over tray 204. When a broken wafer is identified, the suction head is moved to the location of the broken wafer, and a suction generator is energized to remove the broken wafer from the tray. Sensing mechanism 244 then confirms successful removal of the broken wafer, and the system returns to operation.

Additionally, in the embodiment of FIG. 2B hanger 219 is equipped with implements to remove the susceptor 208 from within the chamber 200 and move it to the loading chamber 220. When a image processor or the operator identifies a broken wafer inside the processing chamber 200, hanger 219 is moved into the processing chamber 200 and engages the susceptor 208. It then transports the susceptor 208 to the loading chamber 220. At loading chamber 220 the suction head is moved to the location of the broken wafer and a suction generator is energized to remove the broken wafer from the susceptor 208. Sensing mechanism 244 then confirms successful removal of the broken wafer, and the system returns to operation.

According to an embodiment of the invention, when image processor utilizes an image of sensor 246 to indicate that a wafer has been broken on the susceptor 208, the hanger 219 is used to engage the susceptor and bring it to sensor 244 for a second inspection. If sensor 244 also indicates that the wafer is indeed broken, then the hanger can be used to move the susceptor to station 220 for removing the broken pieces.

According to another embodiment, the system of FIG. 2B has sensor 244, but does not have sensor 246. According to this embodiment, when a hanger is moved into the loadlock with fresh wafers, sensor 244 is used to record each location on the hanger which is occupied by a wafer. Then, when the hanger is sent back to the chamber to remove the processed wafers, the sensor 244 is again used to check whether all of the locations on the hanger that were previously occupied by a wafer are still occupied. If not, this is an indication that the wafer broke and is still inside the chamber. The hanger is then sent to retract the susceptor and deliver it to the loading chamber 220 to use the suction head to remove the broken wafer from the susceptor.

FIG. 2C illustrates another embodiment, showing a first processing chamber 200 and a second processing chamber 201. Positioned between the first and second processing chambers is a flipping station 221. This configuration is advantageous when chamber 210 is used to process one surface of the wafers, and chamber 201 is used to process the other side of the wafers. Therefore, after processing the wafers in the first chamber 200, the tray 204 (or hanger) is moved to flipping station 221, where the wafers on the tray 204 are flipped. The tray 204 then moves into the second chamber 201 for processing. When processing is completed in the second chamber, the tray is moved to unloading chamber 226. Note that the flipping station 221 is in atmosphere, so that loadlocks 216 and 222 are provided on either side of it, which are shown abbreviated in FIG. 2C. Also, loadloack 223 is provided between processing chamber 201 and unloading chamber 226.

In this example, the broken wafer recovery system is provided on the flipping station 226. The broken wafer recovery system can be in the form of those described with respect to FIGS. 2A and 2B above. As with the previous examples, various sensors, here sensors 244, 246 and 248, communicate with controller 205 to identify breakage of wafers. For example, if any of sensors 244, 246 or 248 detects a broken wafer, the tray 204 is moved to the flipping mechanism and the suction head 254 is used to remove the broken wafer from the tray. Sensor 248 can be used to verify complete removal of the broken wafer from the tray, before the wafers are flipped and the tray proceeds into chamber 201.

Figure 3A:
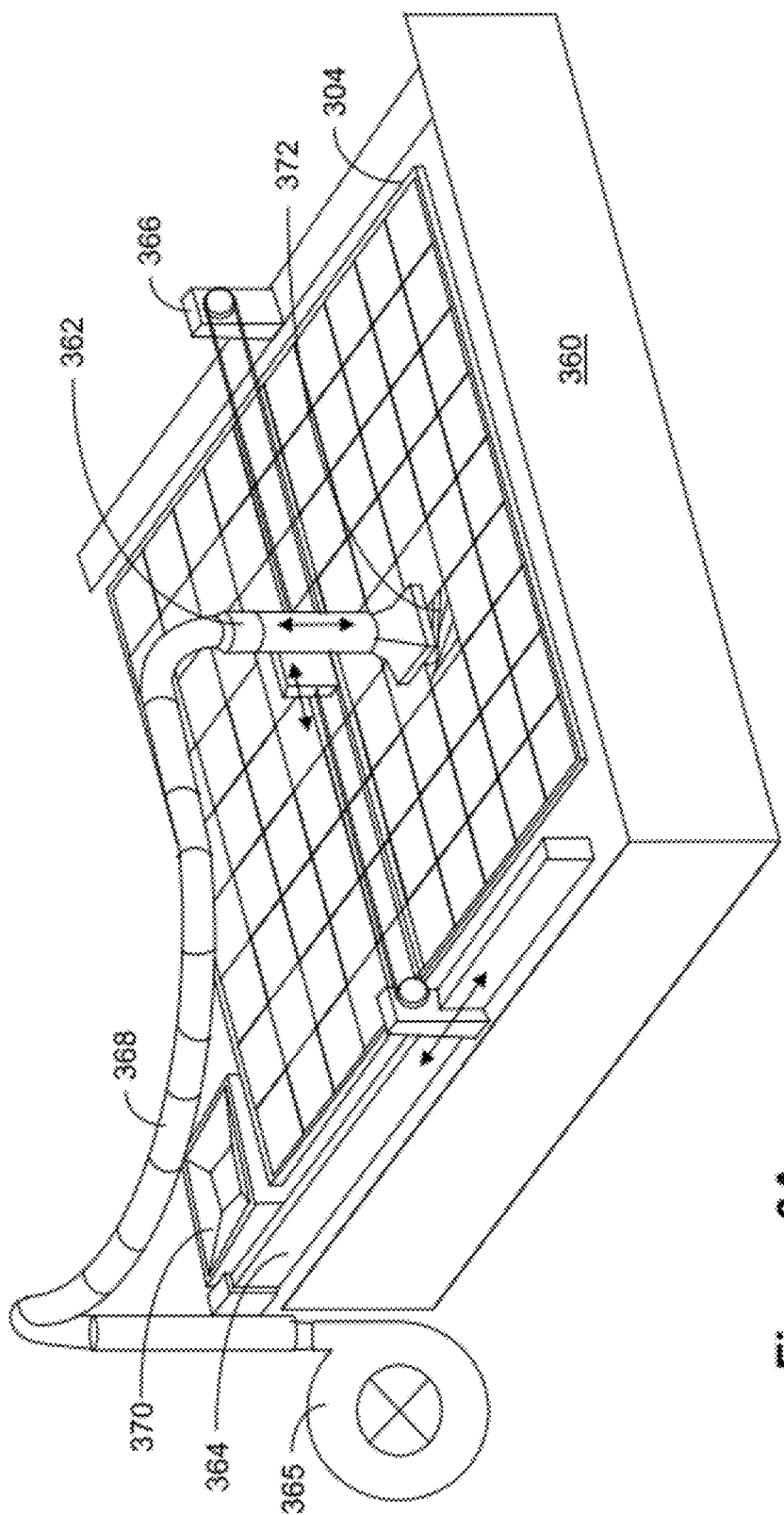
FIG. 3A is a general schematic depicting major components of the broken wafer recovery system according to an embodiment of the invention.

FIG. 3A is a general schematic depicting major components of the broken wafer recovery system according to an embodiment of the invention. The broken wafer recovery system shown in FIG. 3A may be used in any of the embodiments shown above, or in other main-frame, linear, or other system architectures. The recovery system includes a suction head 362 and a mechanism enabling placement of the suction head 362 anywhere above a tray 304 (or a hanger or a susceptor, as described above). In the embodiment of FIG. 3A, the placement mechanism includes a first gantry 364 and a second gantry 366 mounted onto frame 360. The frame 360 may be the frame of the loading chamber, the flipping station, etc. The first gantry 364 moves the suction head 362 in one linear direction, say X direction, and the second gantry 366 moves the suction head 366 in a linear direction perpendicular to the first gantry, i.e., Y direction. This is shown by the double-headed arrows in FIG. 3A. Also illustrated by a vertical double-headed arrow is the capability to move the suction head 362 in a vertical, i.e., z-direction, to lower and retract the suction head from the tray. A flexible house 368 couples the suction head 362 to the suction pump 365.

Another feature illustrated in FIG. 3A is the park and disposal station 370. In this embodiment, when the suction head is not used, it is parked on the station 370. Also, once the suction head removes broken pieces of a wafer, illustrated as broken wafer 372, the suction head is moved to the station 370 and any residual wafer pieces are disposed into the station 370 once vacuum is removed from the suction head.

Figure 3B:
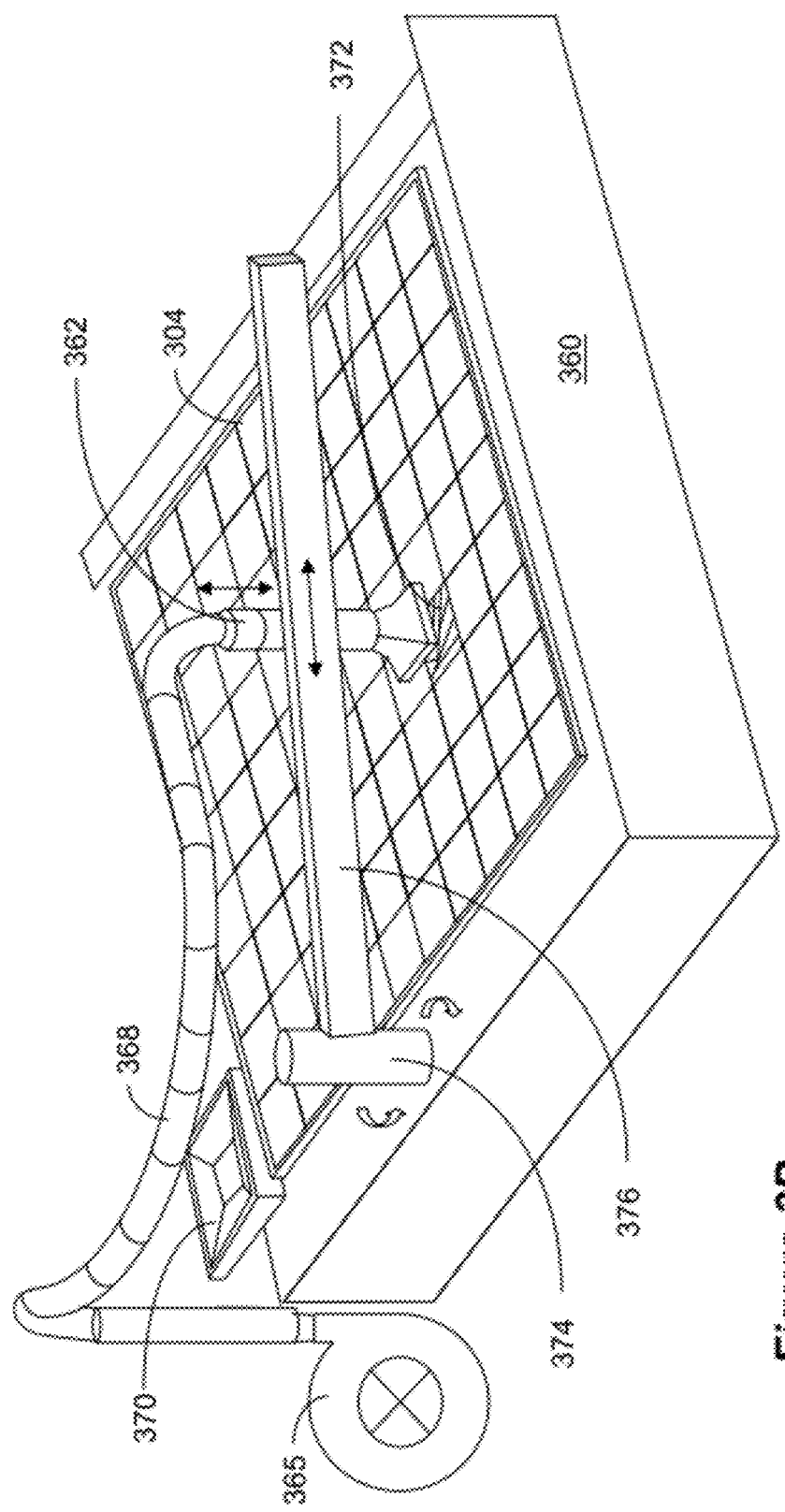
FIG. 3B is a general schematic depicting major components of the broken wafer recovery system according to another embodiment of the invention.

FIG. 3B is a general schematic depicting major components of the broken wafer recovery system according to another embodiment of the invention. The embodiment shown in FIG. 3B is similar to that of FIG. 3A, except that in FIG. 3B an (r,) arrangement is used for the placement mechanism, rather than an (x,y) arrangement. That is, rather than moving the suction head 362 using orthogonal linear directions (i.e., Cartesian coordinates), in the embodiment of FIG. 3B an angular motion about pivot 374, together with linear motion along arm 376, are used to place the suction head at the proper location, using polar coordinates.

FIG. 4 is a general schematic depicting further elements of the broken wafer recovery system shown in FIGS. 3A and 3B. Specifically, FIG. 4 illustrates some details of the suction head 462. As shown in FIG. 4, a hood 469 is mounted at the inlet of the suction head 462. Inside the hood are several retractable pins 480. The pins are used to break the wafer into small pieces that can be easily removed by the suction head and will not get stuck in the suction head or hose leading to the pump. The pins 480 are connected to a common frame 486, through holes 484 provided in the hood 469. The common frame 486 is retractable by the retracting mechanism 488.

FIG. 4 also illustrate set back extensions 481, which ensures that the hood 469 does not fully contact or is sealed to the tray, susceptor or hanger. This ensures that there's sufficient air flow into the inlet to enable proper suction to remove the broken pieces. This also reduce thermal conductance to the hood, especially since if the tray or susceptor is moved out after processing it may be as hot as 300° C. With the set back extensions 481, the hood is kept from heating up by contacting the tray or susceptor.

FIG. 5 illustrates a susceptor that can be used for processing substrates in systems such as those illustrated above. The susceptor 508 is basically in the form of a plate having plurality of seats 591 for wafers. At the center of each seat 591, a hole 593 is provided to enable a lift pin to lift the substrate. In this embodiment, the lift pins do not engage the wafer directly. Rather, a puck 597 is seated inside a puck seat 595 that is provided inside the lift pin hole 593. The lift pin engages the puck, and as it lifts the pucks, it engages and lifts the wafer.

When the broken wafer removal system is fitted into a system utilizing the susceptor of FIG. 5, provisions must be made to avoid sucking the puck when removing broken wafer. According to one embodiment, the pins 480, shown in FIG. 4, are made to engage the puck and hold it in place prior to energizing the suction pump. In such configuration the pins serve dual purpose: they are used to break the wafer to smaller pieces when needed and also to hold the puck during suction.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A broken substrate removable system for use in a substrate processing system to remove pieces of the broken substrate, comprising:
    a suction head having an inlet, the inlet configured to remove pieces of the broken substrate;
    a placing mechanism for moving the suction head to location a of the broken substrate;
    a suction pump;
    a flexible hose coupling the suction head to the suction pump; and,
    a hood positioned at the inlet of the suction head, wherein the hood comprises setback extensions to allow air flow into the inlet to thereby ensure that there is sufficient air flow into the inlet to enable proper suction to remove the pieces of the broken substrate.

2. The system of claim 1, further comprising a plurality of movable pins extendable about the inlet of the suction head to further break the broken substrate.

3. The system of claim 2, further comprising a frame coupled to a retracting mechanism, and wherein the plurality of movable pins are commonly connected to the frame.

4. The system of claim 1, wherein the placing mechanism comprises a first gantry providing linear motion in one direction and a second gantry providing linear motion is a perpendicular direction.

5. The system of claim 1, wherein the placing mechanism comprises a rotatable pivot providing rotational motion and an arm providing linear motion.

6. The system of claim 1, further comprising a parking and disposal station enabling parking of the suction head when not in use and disposal of residual broken pieces removed by the suction head.

7. The system of claim 1, further comprising an optical sensor coupled to a controller to detect the broken substrate and control the placing mechanism to place the suction head above the location of the broken substrate.

8. The system of claim 7, wherein the optical sensor comprises a camera.

9. The system of claim 2, further comprising an optical sensor coupled to a controller to detect the broken substrate and control the placing mechanism to place the suction head above the location of the broken substrate and extend the extendable pins to further break the broken substrate.

10. The system of claim 1, further comprising:
    a controller operating the placing mechanism for moving the suction head to location of the broken substrate.

11. The system of claim 10, further comprising an image processor executing an image processing program to determine whether a substrate has broken.

12. The system of claim 11, further comprising a monitor enabling an operator to confirm or override the image processor's determination.

13. The system of claim 10, further comprising a monitor enabling an operator to designate a substrate as broken.

14. The system of claim 10, further comprising a sensing mechanism to confirm successful removal of the broken substrate.

15. The system of claim 10, further comprising extendable pins and wherein the controller activates the extendable pins so as to further break the broken substrate.

16. The system of claim 10, further comprising an optical sensor sending signals to the controller for at least one of: verification of substrate breakage or verification of complete removal of the broken substrate.

17. The system of claim 16, further comprising an illumination source.

18. The system of claim 16, wherein the optical sensor comprises a camera.

19. The system of claim 10, further comprising a parking station enabling parking of the suction head when not in use.

20. The system of claim 10, further comprising disposal station enabling disposal of residual broken pieces of the broken substrate.

\* \* \* \* \*